（12）United States Patent
Kobayashi et al.

(10) Patent No.: US 12,170,183 B2
(45) Date of Patent: Dec. 17, 2024

(54) CHARGED PARTICLE MICROSCOPE DEVICE AND METHOD FOR ADJUSTING FIELD-OF-VIEW THEREOF

(71) Applicant: Hitachi High-Tech Corporation, Tokyo (JP)

(72) Inventors: Mitsutoshi Kobayashi, Tokyo (JP); Atsushi Miyamoto, Tokyo (JP); Yoshinobu Hoshino, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 451 days.

(21) Appl. No.: 17/761,449

(22) PCT Filed: Sep. 20, 2019

(86) PCT No.: PCT/JP2019/037086
§ 371 (c)(1),
(2) Date: Mar. 17, 2022

(87) PCT Pub. No.: WO2021/053826
PCT Pub. Date: Mar. 25, 2021

(65) Prior Publication Data
US 2022/0351935 A1    Nov. 3, 2022

(51) Int. Cl.
*H01J 37/22*    (2006.01)
*H01J 37/28*    (2006.01)

(52) U.S. Cl.
CPC ............. *H01J 37/222* (2013.01); *H01J 37/28* (2013.01); *H01J 2237/153* (2013.01); *H01J 2237/226* (2013.01)

(58) Field of Classification Search
CPC .... H01J 37/222; H01J 37/28; H01J 2237/153; H01J 2237/226; H01J 2237/2826
See application file for complete search history.

(56) References Cited

U.S. PATENT DOCUMENTS 10,446,366 B1 * 10/2019 Lazic ...................... H01J 37/28
2009/0278539 A1   11/2009 Beatty
(Continued)

FOREIGN PATENT DOCUMENTS

| JP | 2009-268901 A | 11/2009 |
| JP | 2016-209208 A | 12/2016 |

(Continued)

OTHER PUBLICATIONS

International Search Report, PCT/JP2019/037086, dated Dec. 17, 2019, 1 pg.

*Primary Examiner* — David A Vanore
(74) *Attorney, Agent, or Firm* — Volpe Koenig

(57) ABSTRACT

Provided is a method for adjusting a field-of-view of a charged particle microscope device, in which reference data for a sample is set, a plurality of regions of interest are set for the reference data, a rough sampling coordinate group is set for each of the plurality of regions of interest, the sample is irradiated with charged particles based on the sampling coordinate group to obtain a corresponding pixel value group, a plurality of reconstructed images corresponding to the plurality of regions of interest are generated based on the pixel value group, a correspondence relationship among the plurality of regions of interest is estimated based on the plurality of reconstructed images, and the plurality of regions of interest are adjusted based on the correspondence relationship. Here, the sampling coordinate group is set based on the reference data.

15 Claims, 11 Drawing Sheets

(56) References Cited

U.S. PATENT DOCUMENTS

| | | | |
|---|---|---|---|
| 2013/0300854 A1* | 11/2013 | Dong | H01J 37/222 348/80 |
| 2015/0270101 A1* | 9/2015 | Iizuka | H01J 37/3174 250/398 |
| 2015/0371815 A1 | 12/2015 | Potocek | |
| 2016/0118219 A1* | 4/2016 | Potocek | H01J 37/265 250/307 |
| 2017/0035319 A1 | 2/2017 | Zhao | |
| 2022/0351935 A1* | 11/2022 | Kobayashi | H01J 37/222 |
| 2023/0035267 A1* | 2/2023 | Potocek | H01J 37/28 |

FOREIGN PATENT DOCUMENTS

JP 6192682 B2 9/2017
WO 2015/170394 A1 11/2015

* cited by examiner

CHARGED PARTICLE MICROSCOPE DEVICE AND METHOD FOR ADJUSTING FIELD-OF-VIEW THEREOF

TECHNICAL FIELD

The present invention relates to a charged particle microscope device and a method for adjusting a field-of-view thereof.

BACKGROUND ART

As an imaging method of a charged particle microscope, there is a technique described in Japanese Patent No. 6192682 (PTL 1) to reduce damage to a sample. PTL 1 discloses that "According to the invention, the cardinality N (size) of the set {Sn} is a matter of choice, and can be selected in accordance with various factors, such as desired cumulative measurement time and/or imaging sharpness, specimen fragility, etc".

CITATION LIST

Patent Literature

PTL 1: Japanese Patent No. 6192682

SUMMARY OF INVENTION

Technical Problem

The invention is directed to preliminary imaging performed for field-of-view adjustment of main imaging. According to the method in PTL 1, damage to an observation target can be reduced while maintaining the accuracy of the field-of-view adjustment, as compared with a case where the sample is fully sampled by the preliminary imaging. However, there is a problem that it is difficult to set a necessary minimum cardinality since the cardinality N selected once is not adjusted.

Therefore, an object of the invention is to provide a technique capable of minimizing damage to a sample while maintaining the accuracy of field-of-view adjustment.

Solution to Problem

In order to solve the above problem, in a representative charged particle microscope device and method for adjusting a field-of-view thereof according to the invention, reference data for a sample is set, a plurality of regions of interest are set for the reference data, a rough sampling coordinate group is set for each of the plurality of regions of interest, the sample is irradiated with charged particles based on the sampling coordinate group to obtain a corresponding pixel value group, a plurality of reconstructed images corresponding to the plurality of regions of interest are generated based on the pixel value group, a correspondence relationship among the plurality of regions of interest are estimated based on the plurality of reconstructed images, and the plurality of regions of interest are adjusted based on the correspondence relationship. Here, the sampling coordinate group is set based on the reference data. Other aspects of the invention will be clarified in the description of embodiments.

Advantageous Effects of Invention

According to the invention, damage to a sample can be minimized while maintaining the accuracy of field-of-view adjustment.

DESCRIPTION OF EMBODIMENTS

The invention provides a technique capable of minimizing damage to a sample while maintaining the accuracy of field-of-view adjustment. In a charged particle microscope device and a method for adjusting field-of-view thereof, reference data for a sample is set, a plurality of regions of interest are set for the reference data, a rough sampling coordinate group is set for each of the plurality of regions of interest, the sample is irradiated with charged particles based on the sampling coordinate group to obtain a corresponding pixel value group, a plurality of reconstructed images corresponding to the plurality of regions of interest are generated based on the pixel value group, a correspondence relationship among the plurality of regions of interest is estimated based on the plurality of reconstructed images, and the plurality of regions of interest are adjusted based on the correspondence relationship. The sampling coordinate group is set based on the reference data.

Hereinafter, embodiments of the invention will be described with reference to the drawings.

First Embodiment

Figure 1A:
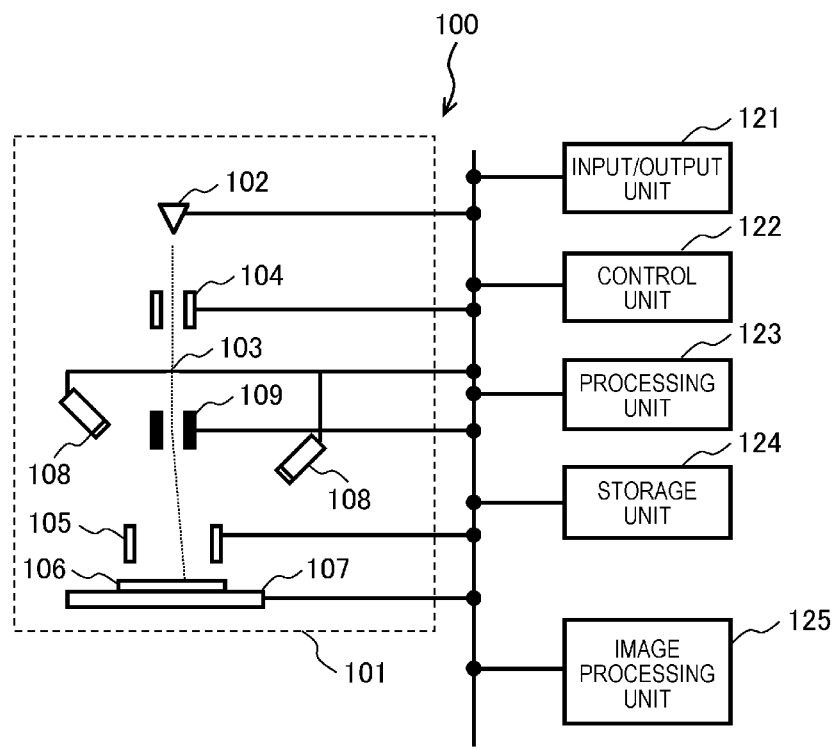
FIG. 1A is a block diagram showing an example of a schematic configuration of a scanning electron microscope device according to an embodiment of the invention.

FIG. 1A is a diagram showing an example of a schematic configuration of a scanning electron microscope device 100 according to an embodiment of the invention. The scanning electron microscope device 100 includes, for example, a scanning electron microscope 101, an input/output unit 121, a control unit 122, a processing unit 123, a storage unit 124, and an image processing unit 125. In the scanning electron microscope 101, an electron beam 103 is generated from an electron gun 102. The electron beam 103 passes through a condenser lens 104 and an objective lens 105, thereby being focused on a surface of a sample 106.

At least a part of the input/output unit 121, the control unit 122, the processing unit 123, the storage unit 124, and the image processing unit 125 may be implemented by one or more computers (hereinafter, referred to as processing subsystems) including a processor, a memory, and a storage device. The processing subsystem may include hardware such as a GPU, an FPGA, an LSI, and an electronic circuit, and may include a display device (for example, a liquid crystal display).

Next, an image is obtained by detecting particles generated from the sample 106 with a detector 108. The image is stored in the storage unit 124. A plurality of detectors 108 may be provided. Further, the detector 108 may be a detector that detects different particles, such as a detector that detects electrons and a detector that detects electromagnetic waves, a detector that detects only particles whose energy or spin direction is within a specific range, or a detector that detects particles having different properties, such as a secondary charged particle detector and a backscattered charged particle detector. A plurality of detectors that detect particles having the same property may be provided at different arrangement positions.

In a case where a plurality of detectors are provided, a plurality of images can be normally obtained by one imaging operation. The sample 106 is placed on or in contact with a stage 107, and an image at any position of the sample can be obtained by moving the stage 107. By two-dimensionally changing a direction of the electron beam 103 by a beam deflector 109, the sample can be scanned with the electron beam.

The input/output unit 121 performs input of an imaging position and an imaging condition, output of an image, and the like. The control unit 122 controls, as control of an imaging device, a voltage applied to the electron gun 102 and the like, focal positions of the condenser lens 104 and the objective lens 105, a position of the stage 107, a deflection degree of the beam deflector 109, and the like. By controlling these, the sample is roughly sampled with the electron beam.

The control unit 122 also controls the input/output unit 121, the processing unit 123, the storage unit 124, and the image processing unit 125. The processing unit 123 performs various types of processing, for example, processing of setting reference data, processing of generating a random number for setting random sampling coordinates, and processing related to automatic focusing necessary for focusing the electron beam 103 on the surface of the sample 106. The storage unit 124 stores the reference data, information of the region of interest, a rough sampling coordinate group, a reconstructed image, a transformation matrix for adjusting the region of interest, various processing parameters, and the like. The image processing unit 125 performs image processing on the obtained data.

Figure 1B:
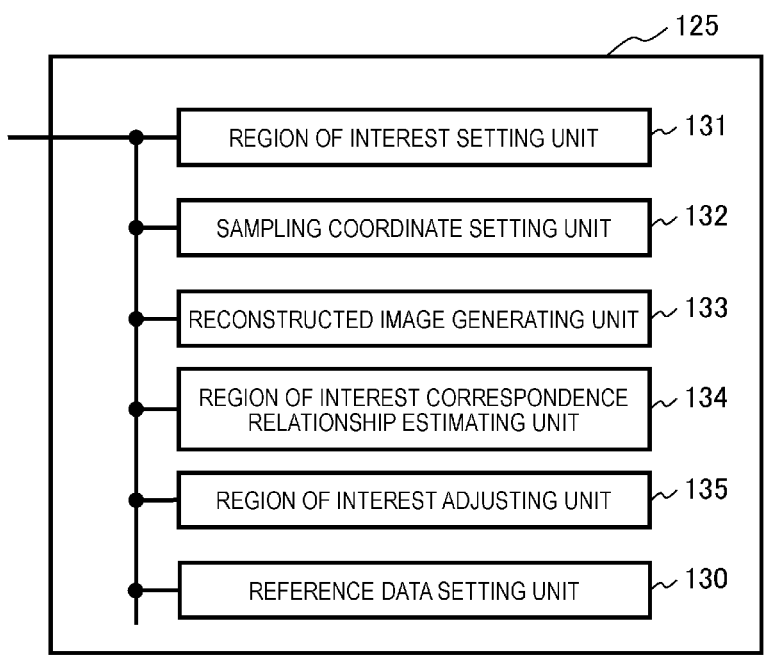
FIG. 1B is a block diagram showing a configuration of an image processing unit in the schematic configuration of the scanning electron microscope device according to the embodiment of the invention.

As shown in FIG. 1B, the image processing unit 125 includes a reference data setting unit 130, a region of interest setting unit 131, a sampling coordinate setting unit 132, a reconstructed image generating unit 133, a region of interest correspondence relationship estimating unit 134, and a region of interest adjusting unit 135.

The region of interest setting unit 131 sets a plurality of regions of interest for the reference data. The sampling coordinate setting unit 132 sets a rough sampling coordinate group for each region of interest. The reconstructed image generating unit 133 reconstructs an image close to a fully sampled captured image from a rough pixel value group obtained by irradiating the rough sampling coordinate group of the region of interest with charged particles.

The region of interest correspondence relationship estimating unit 134 estimates a correspondence relationship among the regions of interest based on the reconstructed image. The region of interest adjusting unit 135 adjusts, based on the estimated correspondence relationship, the region of interest set by the region of interest setting unit 131.

Figure 2:
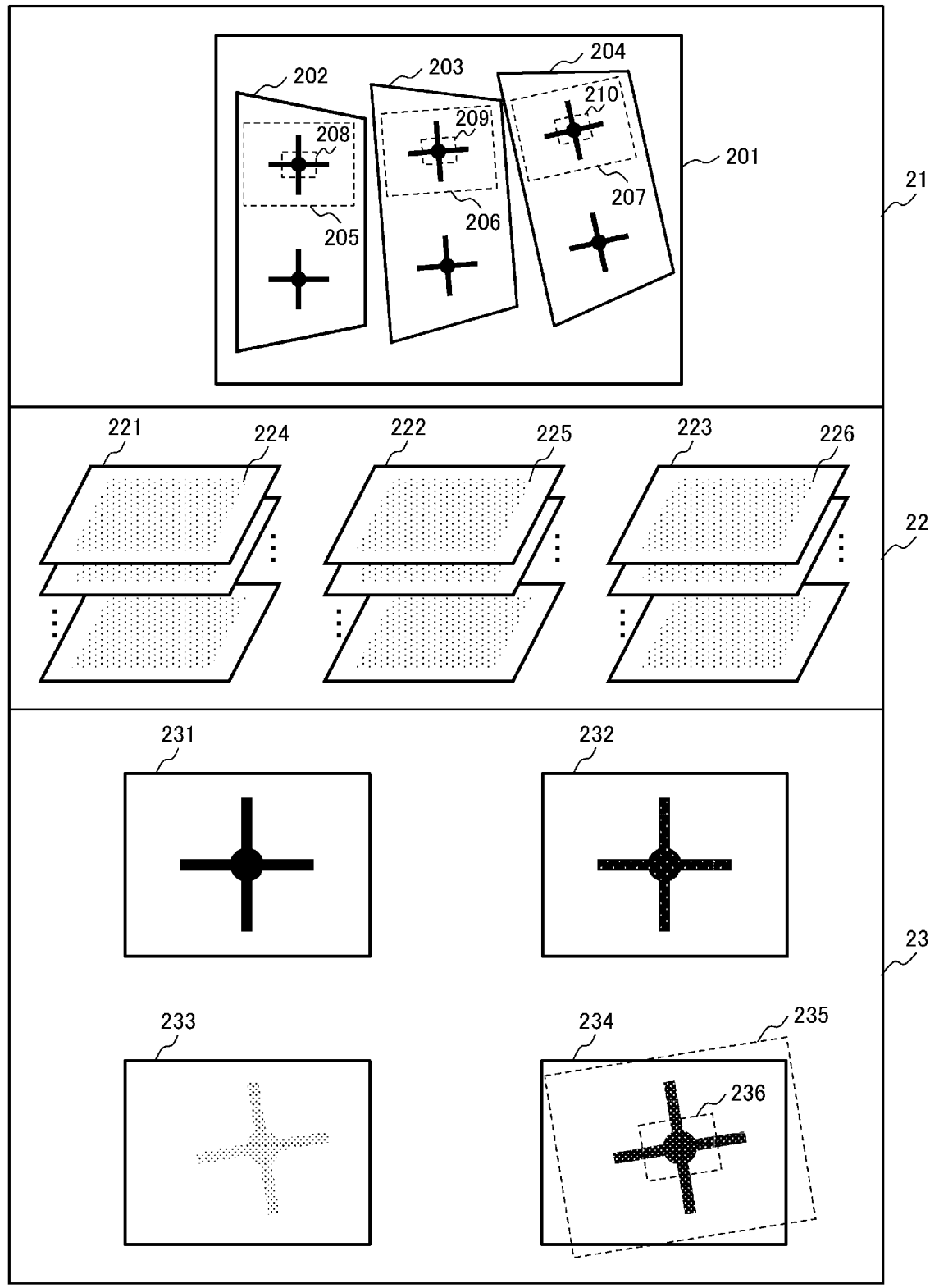
FIG. 2 is a diagram showing an example of a low magnification image of a sample, a rough sampling coordinate group set for each region of interest, and a reconstructed image of the region of interest, which are used to describe FIG. 3.

A method for adjusting a field-of-view of the charged particle microscope device according to the present embodiment will be described with reference to FIGS. 2 to 4. FIG. 2 is a diagram showing an example of a low magnification image 201 of the sample, rough sampling coordinate groups 221 to 223 respectively set for regions of interest 205 to 207, and reconstructed images 232 to 234 of the regions of interest, which are used to describe the flowchart in FIG. 3, and is a conceptual diagram of an image in internal processing. FIG. 4 is an example of a screen of a GUI showing the rough sampling coordinate group on the low magnification image or the reconstructed image.

FIG. 2 shows a low magnification image section 21, a sampling coordinate group section 22, and a reconstructed image section 23. In FIG. 2, the reference data shown in the low magnification image section 21 is the low magnification image 201, and samples 202 to 204 are imaged. The regions of interest 205 to 207 and local regions of interest 208 to 210 are set for the samples 202 to 204, respectively.

For the regions of interest 205 to 207, the rough sampling coordinate groups 221 to 223 shown in the sampling coordinate group section 22 are set, respectively. For example, each of the rough sampling coordinate groups 221 to 223 is set by being divided into eight frames. Distribution ranges 224 to 226 of the rough sampling coordinate groups represent ranges in which rough sampling coordinates are set in the frames. The positions of the rough sampling coordinates in the distribution ranges 224 to 226 in the frames are random, but the numbers of the rough sampling coordinates in the frames are set to be the same.

An image 231 shown in the reconstructed image section 23 is a medium magnification image obtained by fully sampling the region of interest 205. The reconstructed image 232 is an image reconstructed based on a rough pixel group obtained from the rough sampling coordinate group 221 of the region of interest 205. Since the reconstruction based on a rough pixel group leads to deterioration of signal information or artifacts, the image quality of the reconstructed image 232 is generally lower than that of the image 231 obtained by fully sampling the region of interest 205.

The reconstructed image 233 is a medium magnification image reconstructed based on rough pixel groups obtained from two frames of the rough sampling coordinate group 222 of the region of interest 206. Since the number of rough pixel groups used for reconstruction is small, the reconstructed image 233 cannot restore the signal information as compared with the reconstructed image 232.

The reconstructed image 234 is a medium magnification image reconstructed based on rough pixel groups obtained from six frames of the rough sampling coordinate group 222 of the region of interest 206. Since the number of rough pixel groups used for reconstruction is relatively large, the reconstructed image 234 can restore the signal information as compared with the reconstructed image 233.

A region of interest 235 and a local region of interest 236 are obtained by adjusting the region of interest 206 and the local region of interest 209 based on the correspondence relationship among the regions of interest estimated based on the reconstructed image 232 and the reconstructed image 234.

When the setting is made as in the case of the region of interest 206, under an ideal imaging condition without a stage drift or the like, a pattern of a part of the sample appears in the reconstructed image 234 in the same positional relationship as in the reconstructed image 232, and thus it is not necessary to adjust the field-of-view of the region of interest 206. However, since in actual imaging, a stage drift or the like occurs and the region of interest deviates, it is necessary to adjust the region of interest in the medium magnification image.

Figure 3:
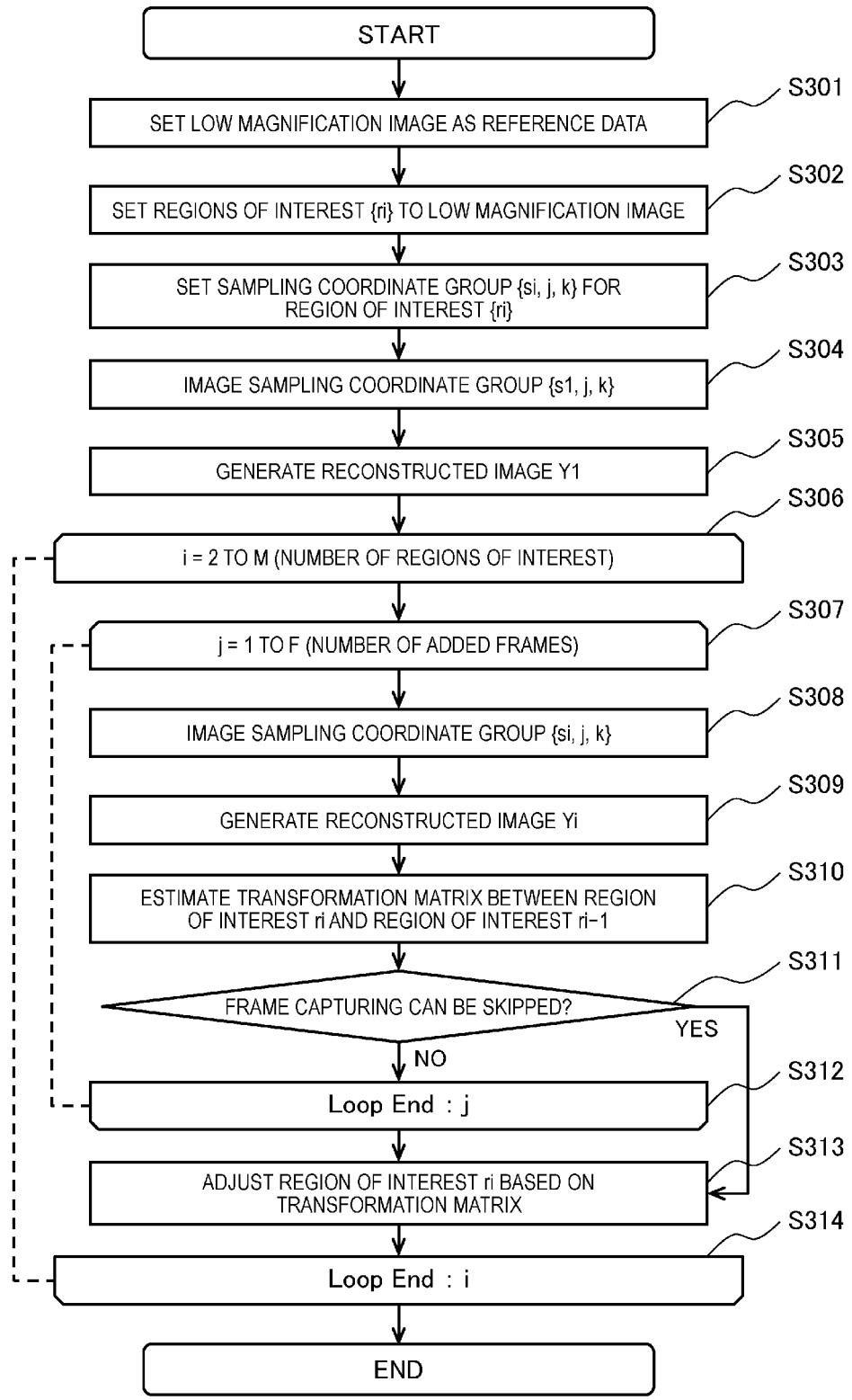
FIG. 3 is a flowchart showing an example of field-of-view adjustment processing according to a first embodiment.
Figure 4:
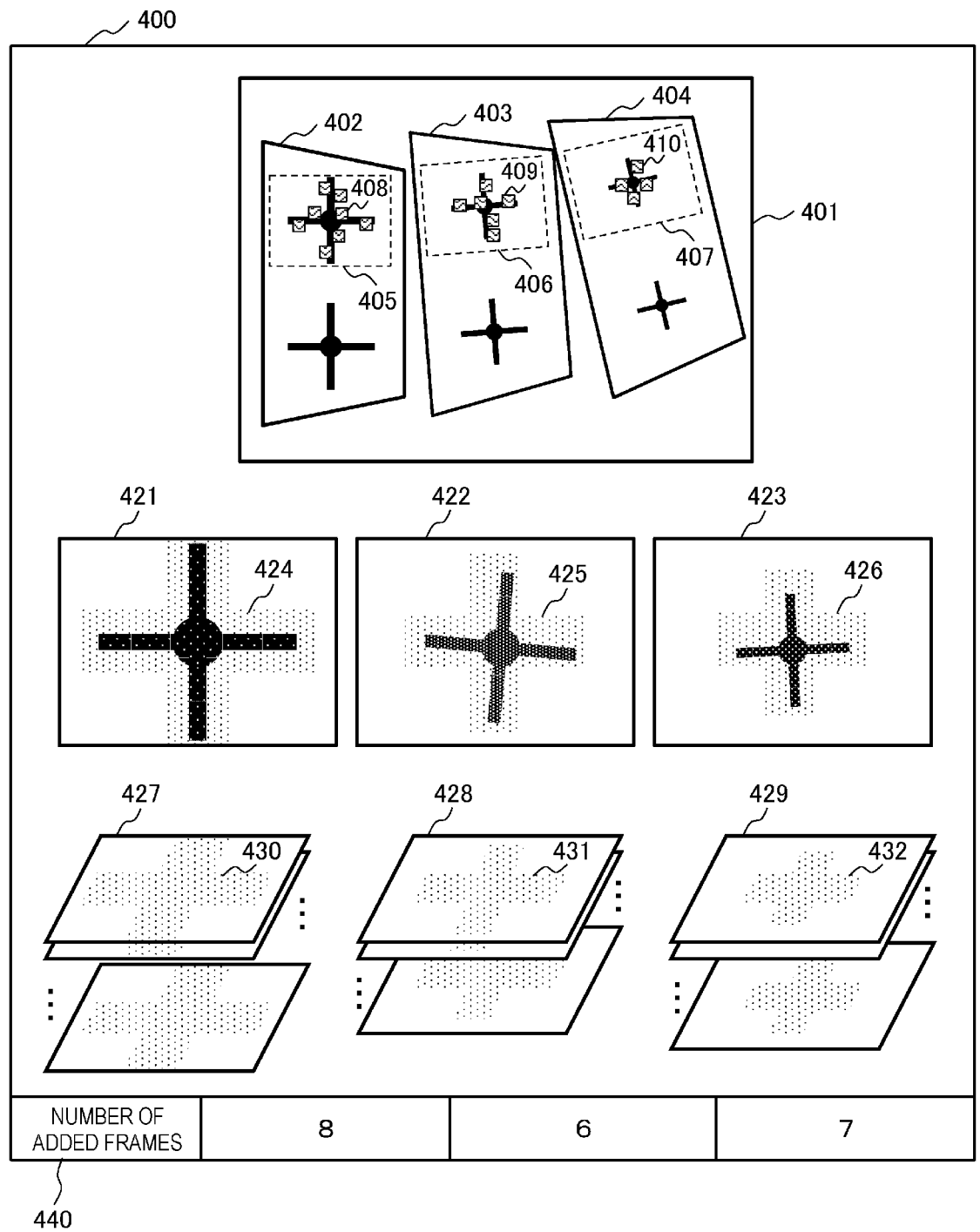
FIG. 4 is an example of a screen of a GUI showing the rough sampling coordinate group on the low magnification image or the reconstructed image.

FIG. 3 is a flowchart showing an example of field-of-view adjustment processing according to the first embodiment. Here, for purposes of illustration, the image shown in FIG. 2 is used. It is assumed that the imaging conditions and the information, which is input or taught by a user, to be used in the processing are set in advance as parameter information and are stored in the storage unit 124.

In step S301, an image obtained by imaging a sample at a low magnification using a charged particle microscope is set as reference data. This corresponds to setting the low magnification image 201 as the reference data. An image reconstructed based on a rough pixel group obtained from a rough sampling coordinate group set in the region of the low magnification image 201 may be used as the reference data. If there is a correspondence between individual data and stage coordinates, as the reference data, an image captured by an optical microscope may be used, or design data of a sample by computer-aided design (CAD) or the like may be used.

In step S302, a plurality of regions of interest {ri} (i=1 to M, M: the number of regions of interest) are set for the low magnification image. This corresponds to setting the regions of interest 205 to 207 for the low magnification image 201. As a method for setting a region of interest, a template image of the region of interest may be created and the region of interest may be set by template matching. Alternatively, the region of interest may be geometrically set based on information taught by a user, such as a corresponding side of each sample, on the reference data.

In step S303, a j-th rough sampling coordinate group {si, j, k} (i=1 to M, j=1 to F, F: the number of added frames, k=1 to Nj, Nj: the number of samplings for each frame) is set for each region of interest {ri} based on the reference data.

This corresponds to setting the rough sampling coordinate groups 221 to 223 by providing the regions of interest 205 to 207 with the distribution ranges 224 to 226 of the rough sampling coordinate groups, respectively.

As a method for setting the distribution range of the rough sampling coordinate group, a range having a significant signal for field-of-view adjustment may be extracted and set based on image analysis, or may be set based on the information taught by the user on the reference data.

The number of added frames may be set based on user input. The distribution range of the rough sampling coordinate group may be different for each region of interest, and the number of distributions may be plural. Further, the total number of the rough sampling coordinates, the number of added frames, and the number of sampling coordinates assigned to each frame may be different. A specific example of step S303 will be described later with reference to FIGS. 5 to 8.

In step S304, a sampling coordinate group {s1, j, k} of a region of interest as a representative region of interest is irradiated with charged particles to obtain a corresponding rough pixel value group {y1, j, k}. This corresponds to setting the representative region of interest as the region of interest 205.

In step S305, a reconstructed image Y1 is generated based on the rough pixel value group {y1, j, k} obtained from the sampling coordinate group {s1, j, k} of the representative region of interest. This corresponds to generating the reconstructed image 232 based on the rough pixel group that is obtained from the rough sampling coordinate group 221 of eight frames set for the region of interest 205.

As a method for generating a reconstructed image, compressed sensing is used. In one method of the compressed sensing, assuming that sampling data is sparse in an expression space using a dictionary image, an image close to a captured image in full sampling can be reconstructed, by a linear sum of the dictionary image, based on sampling data of which the number is smaller than that of data of full sampling. The dictionary image may be a dictionary image created based on general discrete cosine transform, a dictionary image created based on the reference data, or a dictionary image designated by the user.

In step S306, steps S307 to S313 are looped starting from i=2 until reaching the number of regions of interest M. The representative region of interest, as the first region of interest, is excluded from the loop of step S306. Here, the first region of interest, which is the representative region of interest in the low magnification image 201, is the region of interest 205, and the number of regions of interest M is three.

In step S307, steps S308 to S311 are looped by the number of added frames F of the sampling coordinate group for each region of interest. Here, the number of added frames F of the sampling coordinate groups of the regions of interest 206 and 207 is 8.

In step S308, the sampling coordinate group {si, j, k} of the j-th frame of an i-th region of interest {ri} is irradiated with charged particles to obtain a corresponding rough pixel value group {yi, j, k}. Here, the second and third regions of interest are the regions of interest 206 and 207.

In step S309, a reconstructed image {Yi} is generated based on the rough pixel value group {yi, j, k} obtained from the rough sampling coordinate group {si, j, k} from the first frame to the j-th frame of the i-th region of interest {ri}. It is not always necessary to generate a reconstructed image, and whether to generate a reconstructed image may be determined based on user input. The dictionary image may be a dictionary image created based on data previously obtained from the representative region of interest and the regions of interest.

In step S310, a transformation matrix between the i-th region of interest {ri} and an (i−1)th region of interest {ri−1} is estimated. This corresponds to, for example, estimating a transformation matrix for matching the reconstructed image 234 of the second region of interest 206 and the reconstructed image 232 of the first region of interest 205. Here, the transformation matrix means a positional deviation correction amount between the regions of interest.

When it is desired to consider translation, rotation, magnification, and skew distortion as the positional deviation correction amount, an affine transformation matrix is used as the transformation matrix. When it is desired to consider more complicated image distortion, a nomography transformation matrix or the like is used as the transformation matrix.

As a method for estimating a transformation matrix, there is a method for extracting feature points of images and recording feature amounts using a scale invariant feature transform (SIFT) or the like, calculating a similarity of the feature points between the images based on a difference value of the feature amounts or the like, and associating the feature points as a pair to calculate a transformation matrix between the images. When the transformation matrix of the i-th region of interest is estimated, it is not always necessary to compare the i-th region of interest with the (i−1)th region of interest.

In step S311, if an appropriate transformation matrix can be estimated before step S310, the processing exits the loop of step S307. The validity of the transformation matrix is determined by, for example, convergence of values of the transformation matrix in each frame.

Specifically, the reconstructed images 233 and 234 are assumed as images reconstructed based on the sampling coordinate groups up to the second and sixth frames of the second region of interest, and the reconstructed image 232 is assumed as an image reconstructed based on all rough sampling coordinates of the first region of interest 205.

Although the transformation matrix can be estimated between the reconstructed image 233 and the reconstructed image 232, an error is large with respect to values of the transformation matrices up to the third and fourth frames. On the other hand, when the transformation matrix is estimated between the reconstructed image 234 and the image 231, the values of the transformation matrices up to the fourth, fifth, and sixth frames converge with small errors. The threshold value of the error for determining that the value of the transformation matrix converges may be set based on user input.

In step S312, the loop processing is executed until j reaches the number of added frames F, and if j is the number of the added frames F, the loop processing is ended.

In step S313, the i-th region of interest is adjusted based on the estimated transformation matrix. This corresponds to, for example, adjusting the region of interest 206 before adjustment, which is an outer frame of the reconstructed image 234 in the second region of interest 206, to the region of interest 235, which is the region of interest 206 after adjustment. When the i-th and subsequent regions of interest are adjusted, the transform matrices estimated up to the (i−1)th region of interest may be used.

In step S314, if i is the number of regions of interest M, the loop processing is ended. When the flowchart in FIG. 3 is ended, the field-of-view of each region of interest can be adjusted by preliminary imaging, and preparation for main imaging of a local region of interest is completed. This corresponds to, for example, having the region of interest 235 and the local region of interest 236 after adjustment in the second region of interest 206.

Accordingly, it is possible to set a sampling coordinate group effective for estimating the correspondence relationship among the regions of interest based on the reference data, and thus it is possible to reduce damage to the sample. In addition, by estimating the correspondence relationship among the regions of interest based on the reconstructed images sequentially generated according to the number of frames and controlling the number of added frames based on whether the correspondence relationship is estimable, it is possible to minimize damage to the sample while maintaining the accuracy of the field-of-view adjustment.

Next, a relationship between the flowchart shown in FIG. 3 and the diagram of the graphic user interface (GUI) shown in FIG. 4 will be described.

FIG. 4 is an example of a screen of a GUI showing the rough sampling coordinate group on the low magnification image or reconstructed image. On a screen 400 of the GUI, rough sampling coordinate groups 408 to 410 set for regions of interest 405 to 407 are displayed on a low magnification image 401. In addition, distribution ranges 424 to 426 of the rough sampling coordinate groups set on reconstructed images 421 to 423 of the regions of interest 405 to 407 are displayed.

Similar to the rough sampling coordinate groups 408 to 410, the distribution ranges 424 to 426 of the rough sampling coordinate groups may be indicated as rough sampling coordinate groups. Further, in order to display a result of controlling the number of frames to be sampled depending on whether the transformation matrix between the regions of interest is actually estimable, sampling coordinate groups 427 to 429 are displayed. Here, for example, the numbers of frames of the sampling coordinate groups 427 to 429 are 8, 6, and 7, respectively.

First, in step S301 in FIG. 3, the low magnification image 401 is set as the reference data on the screen 400 of the GUI in FIG. 4.

Next, in step S302, the regions of interest 405 to 407 are set, based on template matching or an image taught by the user, on the low magnification image 401 displayed on the screen 400 of the GUI in FIG. 4.

Next, in step S303, for example, the rough sampling coordinate groups 408 to 410 of the regions of interest 405 to 407 set based on the data taught by the user are displayed on the screen 400 of the GUI so as to overlap the regions of interest 405 to 407.

Next, in step S304, the rough sampling coordinate group 427 of all frames (for example, eight frames) is displayed on the screen 400 of the GUI. The rough sampling coordinate group 427 of all frames is obtained by taking the region of interest 405 as a representative region of interest and imaging the rough sampling coordinate group 408 {s1, j, k} of the representative region of interest 405 using the charged particle microscope.

Next, in step S305, the reconstructed image 421 Y1 is created based on the rough pixel value group obtained from the sampling coordinate group 427 of all frames (eight frames) of the representative region of interest 405, and is displayed on the screen 400 of the GUI. The distribution range 424 of the rough sampling coordinate group 408 may be displayed on the reconstructed image 421.

Next, while repeatedly executing steps S306 to S314, sampling coordinate groups 428 and 429 of all frames are displayed on the screen 400 of the GUI. The sampling coordinate groups 428 and 429 of all frames are obtained in step S308 of imaging the sampling coordinate groups 409 and 410 {si, j, k}.

The reconstructed images 422 and 423, which are sequentially generated in step S309 of generating a reconstructed image, in the regions of interest 406 and 407 are displayed on the screen 400 of the GUI in FIG. 4.

In step S311 of checking whether frame imaging can be skipped, when it is determined that the value of the transformation matrix converges with the number of frames smaller than a preset number of frames (for example, eight), the number of frames is displayed in a section 440 of the number of added frames on the screen 400 of the GUI in FIG. 4.

According to the present embodiment, by varying the number of samplings for each region of interest and reducing the number of samplings to the number of samplings necessary for field-of-view adjustment, it is possible to shorten the sampling time and reduce damage to the sample.

[First Modification]

Next, as a first modification of the method for setting the sampling coordinate group {si, j, k} of the region of interest {ri} in step S303 in the flowchart of FIG. 3, an example in which the number of rough samplings is set to be different for each region of interest will be described with reference to FIGS. 5 and 6.

Figure 5:
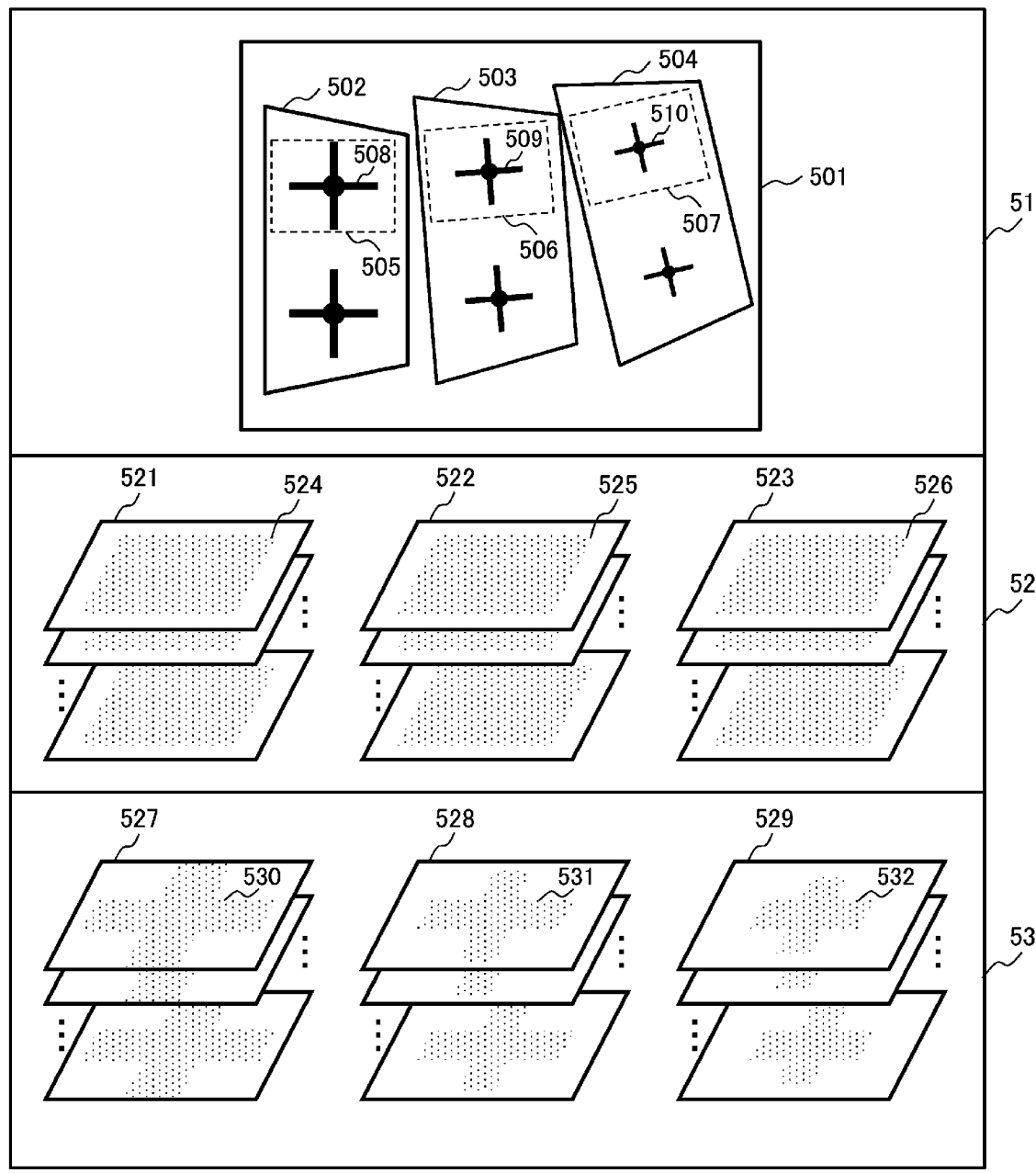
FIG. 5 is a diagram showing an example of a low magnification image of a sample and a rough sampling coordinate group set for each region of interest, which are used to describe FIG. 6.
Figure 6:
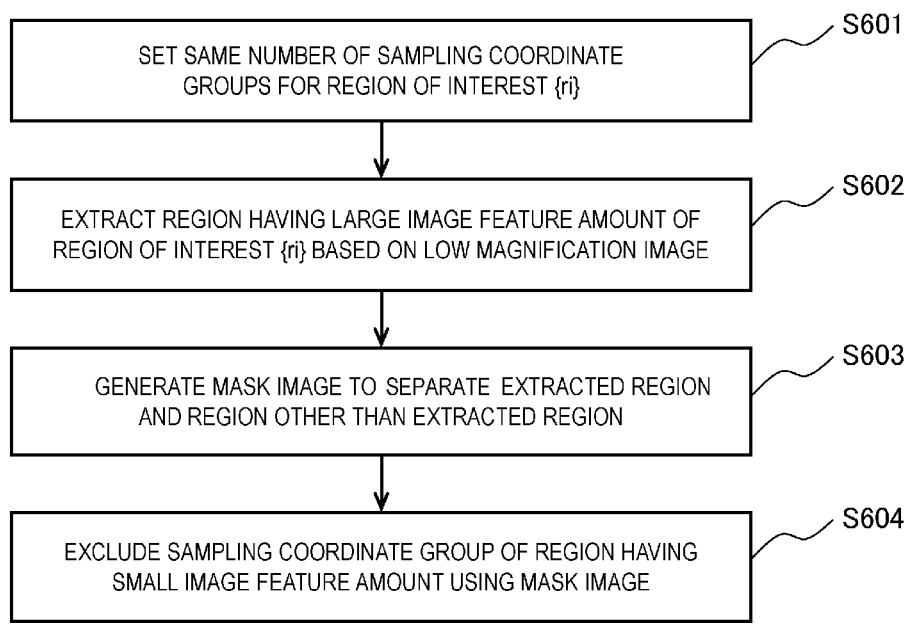
FIG. 6 is a flowchart showing an example in which the number of rough samplings is set to be different for each region of interest in step S303 according to the first embodiment.

FIG. 5 is a diagram showing an example of a low magnification image 501 of a sample and rough sampling coordinate groups 527 to 529 set for regions of interest 505 to 507, respectively, which are used to describe FIG. 6, and shows a low magnification image section 51, a temporary rough sampling coordinate group section 52, and a rough sampling coordinate group section 53. Reference data shown in the low magnification image section 51 is the low magnification image 501, and samples 502 to 504 are imaged. Patterns 508 to 510 in the sample are different for the samples 502 to 504.

The regions of interest 505 to 507 are set for the samples 502 to 504, respectively. Temporary rough sampling coordinate groups 521 to 523 as shown in the temporary rough sampling coordinate group section 52 and the rough sampling coordinate groups 527 to 529 as shown in the rough sampling coordinate group section 53 are set for the regions of interest 505 to 507, respectively. For example, each of the temporary rough sampling coordinate groups 521 to 523 and the rough sampling coordinate groups 527 to 529 is set by being divided into eight frames. The positions of the rough sampling coordinates in distribution ranges 524 to 526 and 530 to 532 of each frame are random, but the densities of the rough sampling coordinates are set to be the same.

FIG. 6 is a flowchart according to the present modification showing an example in which the number of rough samplings is set to be different for each region of interest in step S303 according to the first embodiment. Here, for purposes of illustration, FIG. 5 is used. Although the patterns 508 and 510 of the sample are different between the low magnification image 501 and the low magnification image 201, step S601 corresponds to step S303. Therefore, the rough sampling coordinate groups 521 to 523 and the distribution ranges 524 to 526 of the rough sampling coordinate groups correspond to the rough sampling coordinate groups 221 to 223 and the distribution ranges 224 to 226 of the rough sampling coordinate groups described with reference to FIG. 2, respectively.

In step S602, a region having a large image feature amount of the region of interest is extracted based on the low magnification image. This corresponds to extracting the patterns 508 to 510 for the regions of interest 505 to 507 of the low magnification image 501. As a method for extracting a region having a large image feature amount, there is a method for extracting an edge by a Sobel filter or the like and setting a region so as to surround an edge component.

In step S603, a mask image is generated to separate the region having a large image feature amount and a region other than the region. As a method for generating a mask image, there is a method for binarizing a pixel value of the region having a large image feature amount as 1 and other pixel values as 0. Considering that a positional deviation occurs in the pattern of the sample between the regions of interest, a region having a pixel value of 1 may be expanded by performing contraction processing on a binary image.

In step S604, a rough sampling coordinate group of a region having a small image feature amount is excluded using the mask image. This corresponds to setting the rough sampling coordinate groups 527 to 529 by using the mask image for each of the regions of interest 505 to 507 to exclude, from the temporary rough sampling coordinate groups 521 to 523, the sampling coordinate whose pixel value of the mask image is 0. In this case, the distribution ranges 530 to 532 of the rough sampling coordinate groups correspond to the regions in which the pixel value of the mask image for each of the regions of interest 505 to 507 is 1.

Accordingly, by varying the number of samplings for each region of interest and reducing the number of samplings to the number of samplings necessary for field-of-view adjustment, it is possible to shorten the sampling time and reduce damage to the sample.

[Second Modification]

Next, as a second modification of the method for setting the sampling coordinate group {si, j, k} of the region of interest {ri} in step S303 in the flowchart of FIG. 3, an example in which a sampling coordinate group having the same positional relationship as that of the representative region of interest is set for another region of interest will be described with reference to FIGS. 7 and 8. The present modification is applied to a case where a sample such as a semiconductor device in which a large number of patterns having substantially the same structure are formed is observed using a stage having a small positional deviation.

Figure 7:
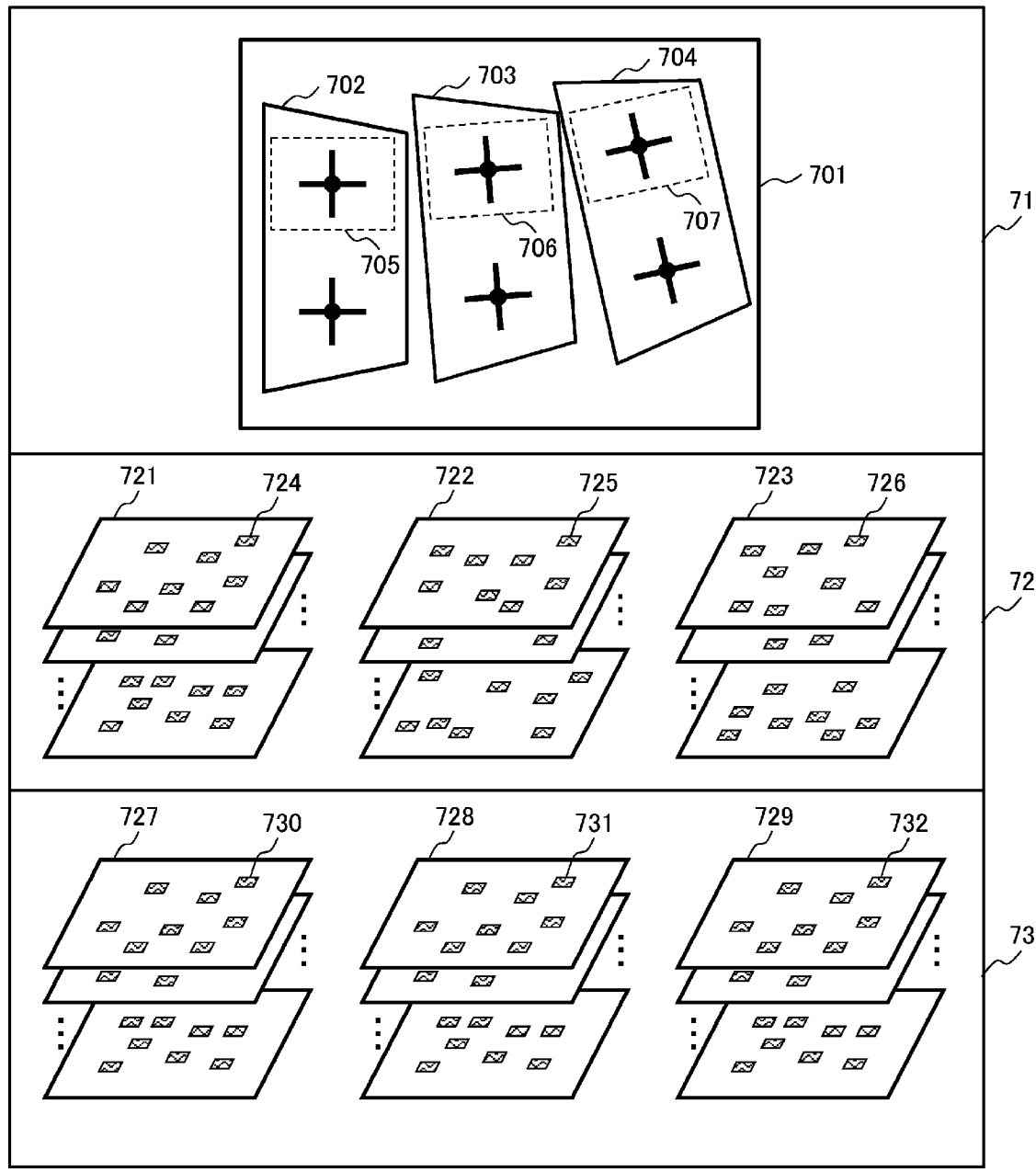
FIG. 7 is a diagram showing an example of a low magnification image of a sample and a rough sampling coordinate group set for each region of interest, which are used to describe FIG. 8.
Figure 8:
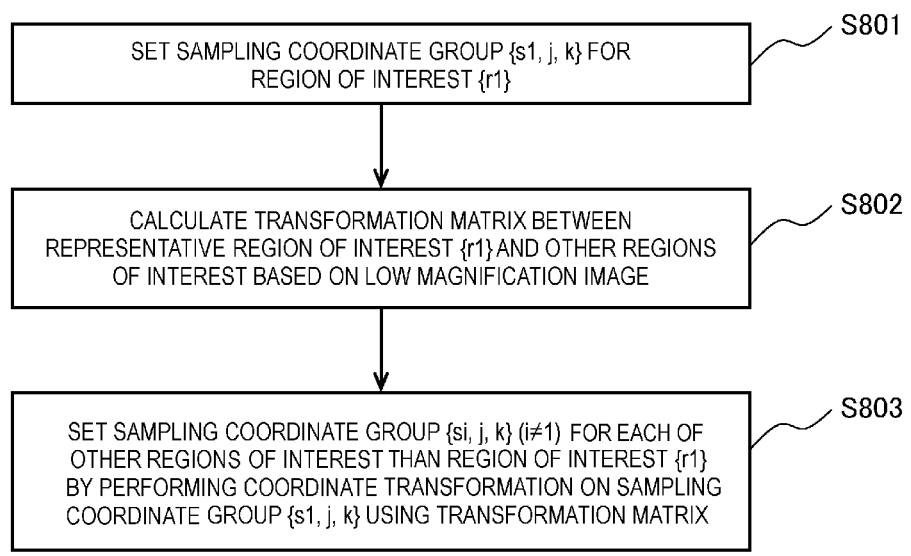
FIG. 8 is a flowchart showing an example in which a sampling coordinate group having a positional relationship same as that of a representative region of interest is set for another region of interest in step S303 according to the first embodiment.

FIG. 7 is a diagram showing an example of a low magnification image 701 of a sample and rough sampling coordinate groups 727 to 729 set for regions of interest 705 to 707, which are used to describe FIG. 8, and shows a low magnification image section 71, a rough sampling coordinate group section 72, and a rough sampling coordinate group section 73. The reference data is the low magnification image 701 shown in the low magnification image section 71, and samples 702 to 704 are imaged. The regions of interest 705 to 707 are set for the samples 702 to 704, respectively. The rough sampling coordinate groups 727 to 729 shown in the rough sampling coordinate group section 73 are set for the regions of interest 705 to 707, respectively. For example, each of the rough sampling coordinate groups 727 to 729 is set by being divided into eight frames.

Rough sampling coordinate points 730 to 732 shown in the rough sampling coordinate group section 73 indicate the sampling coordinate points of each frame. Rough sampling coordinate groups 721 to 723 shown in the rough sampling coordinate group section 72 correspond to the rough sampling coordinate groups 221 to 223 described with reference to FIG. 2.

Rough sampling coordinate points 724 to 726 shown in the rough sampling coordinate group section 72 indicate specific sampling coordinate points with respect to the distribution ranges 224 to 226 of the rough sampling coordinate groups described with reference to FIG. 2. The positional relationship of the rough sampling coordinate points 724 to 726 in the rough sampling coordinate groups 721 to 723 is random. On the other hand, the rough sampling coordinate points 730 to 732 in the rough sampling coordinate groups 727 to 729 have the same positional relationships among the regions of interest. The positional relationship of the sampling coordinate point in the rough sampling coordinate group 721 and the positional relationship of the sampling coordinate point in the rough sampling coordinate group 727 may not be the same.

FIG. 8 is a processing flowchart according to the present modification corresponding to step S303 in the flowchart in FIG. 3 described in the first embodiment, and shows an example in which a sampling coordinate group having the same positional relationship as that of the representative region of interest is set for another region of interest. Here, for purposes of illustration, FIG. 7 is used.

Step S801 is the same as step S303 until a rough sampling coordinate group is set for the first region of interest, which is the representative region of interest. This corresponds to setting the sampling coordinate group 727 for the region of interest 705, similar to the sampling coordinate point 730. If the setting is performed in the same manner as in step S303, for example, the sampling coordinate groups 721 to 723 are set, for the regions of interest 705 to 707, respectively, similar to the sampling coordinate points 724 to 726.

In step S802, a transformation matrix between the representative region of interest and other regions of interest is calculated based on the low magnification image. The transformation matrix is calculated based on, for example, feature point matching among regions of interest in the low magnification image.

In step S803, sampling coordinate groups for the regions of interest other than the representative region of interest are set by performing coordinate transformation on the rough sampling coordinate group of the representative region of interest using the transformation matrix between the representative region of interest and the other regions of interest. This corresponds to setting the sampling coordinate groups 728 and 729 for the regions of interest 706 and 707, similar to the sampling coordinate points 731 and 732.

Accordingly, by setting rough sampling coordinate points having the same positional relationship with respect to the pattern of the sample, it is possible to prevent the variation in image quality of the reconstructed image and maintain the accuracy of the field-of-view adjustment.

In addition, according to the present modification, by varying the number of samplings for each region of interest and reducing the number of samplings to the number of samplings necessary for field-of-view adjustment, it is possible to shorten the sampling time and reduce damage to the sample.

Second Embodiment

Next, a second embodiment according to the invention will be described with reference to FIGS. 9 to 11. A configuration of a scanning electron microscope device according to the present embodiment is the same as that of the scanning electron microscope device 100 described with reference to FIGS. 1A and 1B in the first embodiment, and thus the description thereof will be omitted.

The second embodiment is different from the first embodiment in that a drift amount of the rough sampling coordinate group calculated based on a merged sampling coordinate group is used to correct a drift of the rough sampling coordinate group. Here, the merged sampling coordinate group is a sampling coordinate group obtained by merging at least one rough sampling coordinate to another rough sampling coordinate. One rough sampling coordinate group may be merged to each of a plurality of other rough sampling coordinate groups. The difference between the second embodiment and the first embodiment will be described with reference to FIGS. 9 to 11.

Figure 9:
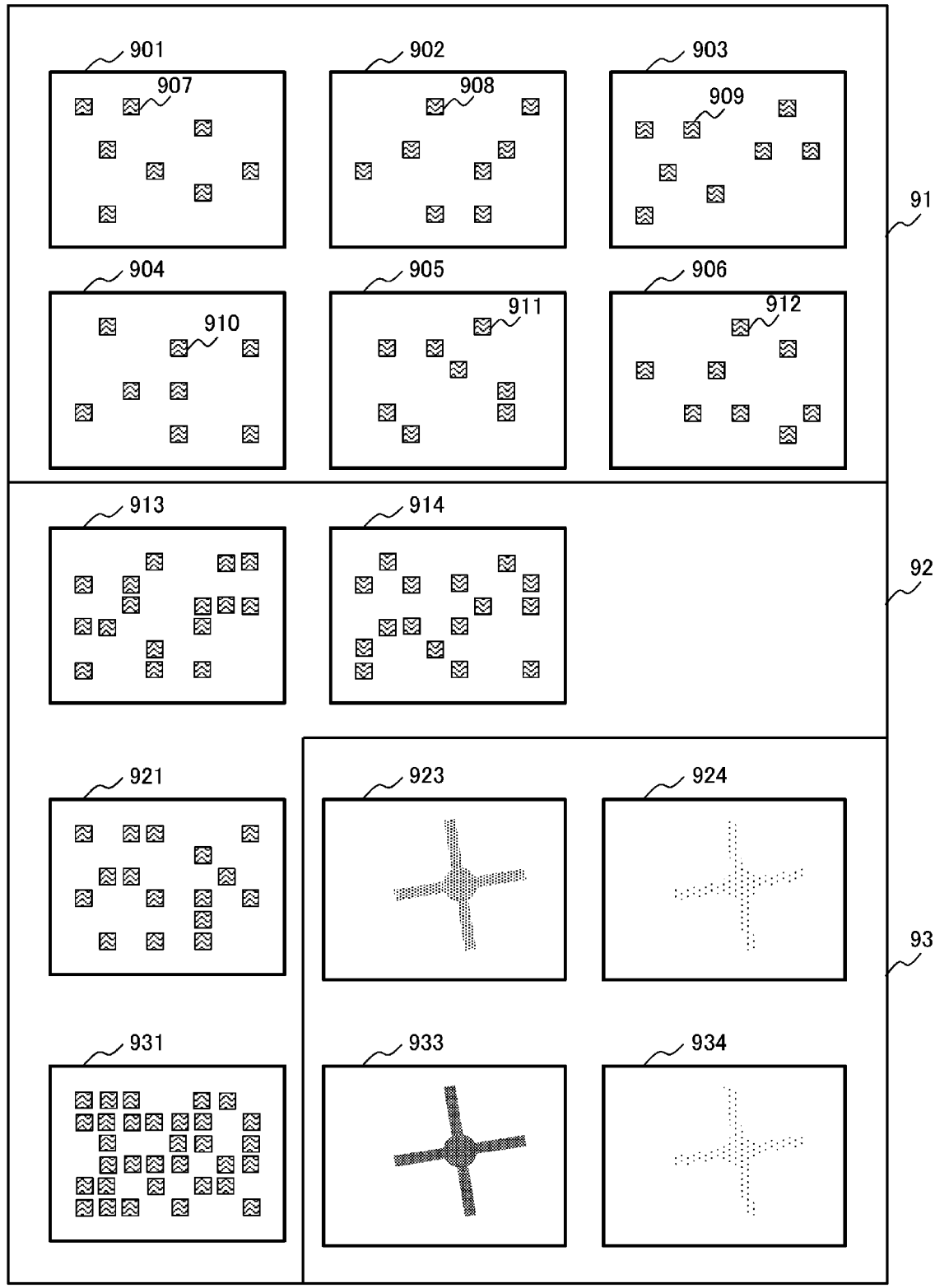
FIG. 9 is a diagram showing an example of a rough sampling coordinate group, a merged sampling coordinate group, and reconstructed images thereof, which are used to describe a second embodiment.

FIG. 9 is a diagram showing an example of a rough sampling coordinate group section 91, a merged sampling coordinate group section 92, and a reconstructed image section 93 thereof, which are used to describe the second embodiment. Rough sampling coordinate groups 901 to 906 shown in the rough sampling coordinate group section 91 correspond to the first to sixth frames of the rough sampling coordinate group 222 set for the region of interest 206. The numbers of sampling coordinate points 907 to 912 of the rough sampling coordinate groups 901 to 906 are the same, but the positions thereof are random.

For convenience of representation of the drawing, only a small number of sampling coordinate points are shown in the rough sampling coordinate group section 91, and for example, 20% of the number of pixels constituting the region of interest when the image is captured with the medium magnification image is the number of sampling coordinate points. A rough sampling coordinate group 913 shown in the merged sampling coordinate group section 92 is obtained by merging the rough sampling coordinate group 902 of the second frame and the rough sampling coordinate group 903 of the third frame, and a rough sampling coordinate group 914 is obtained by merging the rough sampling coordinate group 903 of the third frame and the rough sampling coordinate group 904 of the fourth frame. A rough sampling coordinate group 921 is obtained by merging the rough sampling coordinate group 901 of the first frame and the rough sampling coordinate group 902 of the second frame.

A reconstructed image 923 shown in the reconstructed image section 93 is an image reconstructed based on a pixel group obtained from the rough sampling coordinate group 921, and a reconstructed image 924 is an image reconstructed based on a pixel group obtained from the rough sampling coordinate group 903 of the third frame. The reconstructed image 923 has a medium image quality. On the other hand, the reconstructed image 924 has a low image quality.

A rough sampling coordinate group 931 shown in the merged sampling coordinate group section 92 is obtained by merging the rough sampling coordinate group 901 of the first frame, the rough sampling coordinate group 903 of the third frame, the rough sampling coordinate group 904 of the fourth frame, and the rough sampling coordinate group 905 of the fifth frame. A reconstructed image 933 is an image reconstructed based on a pixel group obtained from the rough sampling coordinate group 931, and a reconstructed image 934 is an image reconstructed based on a pixel group obtained from the rough sampling coordinate group 906 of the sixth frame. The reconstructed image 933 has a high image quality. On the other hand, the reconstructed image 934 has a low image quality.

Figure 10:
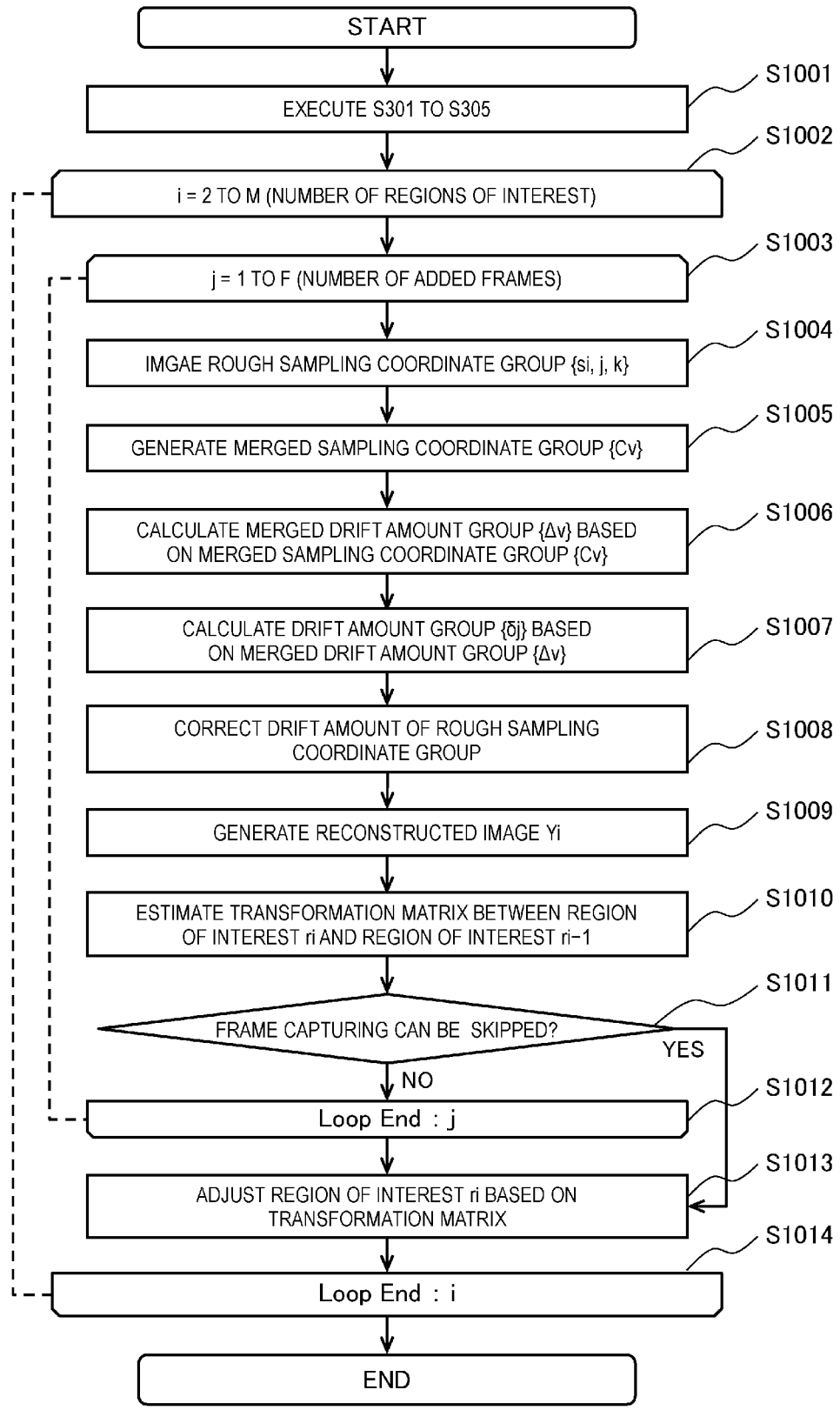
FIG. 10 is a flowchart showing an example of field-of-view adjustment processing according to the second embodiment.

FIG. 10 is a flowchart showing an example of the field-of-view adjustment processing according to the second embodiment. Here, for purposes of illustration, FIGS. 2 and 9 are used. With respect to the flow of the processing described with reference to FIG. 3 in the first embodiment, in the flow of the processing according to the present embodiment shown in FIG. 10, step S1001 is the same as steps S301 to S305, steps S1002 to S1004 are the same as steps S306 to S308, and steps S1010 to S1014 are the same as steps S310 to S314, and thus the description of these steps will be omitted.

Steps S1005 to S1009 for performing processing different from step S309 in the flow of the processing described with reference to FIG. 3 in the first embodiment will be described below. The processing of steps S1005 to S1009 is executed by the reconstructed image generating unit 133.

In step S1005, rough sampling coordinate groups are merged to generate a merged sampling coordinate group. This corresponds to, for example, generating the rough sampling coordinate groups 921, 913, and 914 as shown in FIG. 9, and setting merged sampling coordinate groups C1 to C4 as the rough sampling coordinate groups 901, 921, 913, and 914, respectively, in the loop processing of j=4 of the second region of interest 206 in the low magnification image 201 in FIG. 2.

A merging method may be set based on user input. Here, the user input is a rule that two rough sampling coordinates, that is, a rough sampling coordinate of each frame, except the first frame, and a rough sampling coordinate of its previous frame are merged. The rough sampling coordinate group serving as the basis of the merged sampling coordinate group may be a rough sampling coordinate group in which the drift is corrected in the loop processing before step S1003.

In step S1006, a merged drift amount group is calculated based on the merged sampling coordinate group. This corresponds to, for example, calculating merged drift amounts $\Delta 2$ to $\Delta 4$ of the merged sampling coordinate groups C2 to C4 with respect to the merged sampling coordinate group C1. The merged drift amount $\Delta 1$ of the merged sampling coordinate group C1 as a reference is zero. As a method for calculating the merged drift amount, there is a method for calculating correlations among the merged sampling coordinate groups and calculating the drift amount based on the position of the maximum correlation value.

In step S1007, a drift amount group of the rough sampling coordinate group is calculated based on the merged drift amount group. For example, an approximate curve of the merged drift amounts $\Delta 1$ to $\Delta 4$ is calculated, and interpolation is performed based on the approximate curve, thereby calculating drift amounts $\delta 2$ to $\delta 4$ of the rough sampling coordinate groups 902 to 904.

In step S1008, the drift amount of the rough sampling coordinate group is corrected by the calculated drift amount group. This corresponds to correcting the coordinates of the rough sampling coordinate groups 902 to 904 with the drift amounts $\delta 2$ to $\delta 4$.

In step S1009, a reconstructed image is generated based on a rough pixel value group obtained from a rough sampling coordinate group subjected to drift correction.

Accordingly, since the image quality of the reconstructed image is improved by correcting the drift of the rough sampling coordinate group, it is possible to perform more accurate field-of-view adjustment or field-of-view adjustment with a smaller number of frames.

Figure 11:
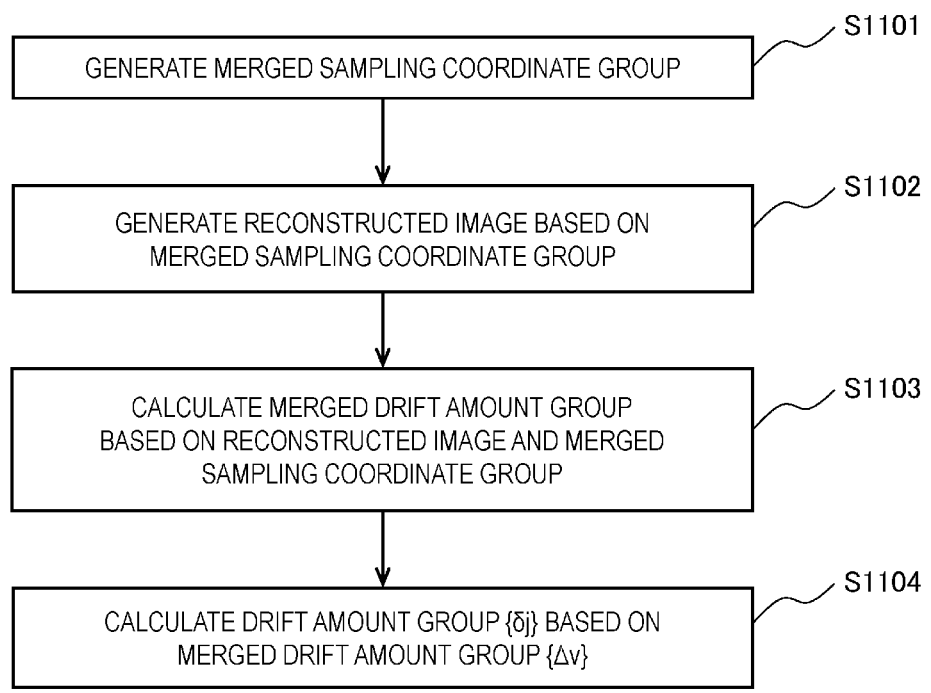
FIG. 11 is a flowchart showing an example of generating a reconstructed image based on a merged sampling coordinate group and calculating a drift amount in steps S1005 to S1007 according to the second embodiment.

FIG. 11 is a flowchart showing an example of generating a reconstructed image based on a merged sampling coordinate group and calculating a drift amount in steps S1005 to S1007 according to the second embodiment. Here, for purposes of illustration, FIGS. 2 and 9 are used.

Step S1101 corresponds to step S1005. In step S1101, a merged sampling coordinate group including rough sampling coordinate groups is generated. This corresponds to, for example, generating the rough sampling coordinate group 921 in the loop processing of j=3 of the second region of interest 206, and setting the merged sampling coordinate groups C1 and C2 as the rough sampling coordinate groups 921 and 903, respectively. This corresponds to, for another example, generating the rough sampling coordinate group 931 in the loop processing of j=6 of the second region of interest 206, and setting the merged sampling coordinate groups C1 to C3 as rough sampling coordinate groups 931, 902, and 906, respectively.

In step S1102, a reconstructed image is generated based on the merged sampling coordinate group. This corresponds to, for one example, generating the reconstructed image 923 based on the rough sampling coordinate group 921 of the merged sampling coordinate group C1. This corresponds to, for another example, generating the reconstructed image 933 based on the rough sampling coordinate group 931 of the merged sampling coordinate group C1.

In step S1103, a merged drift amount group is calculated based on the reconstructed image and the merged sampling coordinate group. This corresponds to, for one example, calculating the merged drift amount $\Delta 2$ based on the reconstructed image 923 and the rough sampling coordinate group 903 of the merged sampling coordinate group C2.

This corresponds to, for another example, calculating the merged drift amounts $\Delta 2$ and $\Delta 3$ based on the reconstructed image 933 and the rough sampling coordinate groups 902 and 906 of the merged sampling coordinate groups C2 and C3. As a method for calculating the drift amount, there is a method for calculating a correlation between the reconstructed image and the rough sampling coordinate group and calculating the drift amount based on the position of the maximum correlation value. When calculating the drift amount, a reconstructed image may be generated based on a rough sampling coordinate group.

In step S1104, a drift amount group is calculated based on the merged drift amount group. This corresponds to, for one example, setting the merged drift amount $\Delta 2$ to the drift amount $\delta 3$ and setting other drift amounts to zero. This corresponds to, for another example, setting the merged drift amounts $\Delta 2$ and $\Delta 3$ to the drift amounts $\delta 2$ and $\delta 6$, and setting other drift amounts to zero. The correspondence relationship between the merged drift amount group and the drift amount group may be set by user input.

Accordingly, the drift amount can be stably calculated by calculating the drift amount between the reconstructed image and the rough sampling coordinate group instead of the merged sampling coordinate group. In addition, by recalculating the drift amount for a rough sampling coordinate group of frames in which the number of frames is small and it is difficult to stably calculate the drift amount, it is possible to improve the accuracy of drift correction.

According to the present embodiment, by varying the number of samplings for each region of interest and reducing the number of samplings to the number of samplings necessary for field-of-view adjustment, it is possible to shorten the sampling time and reduce damage to the sample.

The invention is not limited to the above embodiments, and includes various modifications. For example, the above embodiments have been described for easy understanding of the invention, and the invention is not necessarily limited to those including all the configurations described above. A part of the configuration of an embodiment can be replaced with the configuration of another embodiment, and the configuration of another embodiment can be added to the configuration of an embodiment. It is possible to add, delete, or replace a part of the configuration of the embodiments to, from, or with another configuration. A part or all of the above configurations, functions, processing units, processing means, and the like may be implemented by hardware, for example, by designing an integrated circuit. For example, the above embodiments may be modified. For example, a charged particle gun that generates another charged particle beam may be used in place of the electron gun that generates an electron beam.

REFERENCE SIGNS LIST

100: scanning electron microscope device, 101: scanning electron microscope, 121: input/output unit, 122: control unit, 123: processing unit, 124: storage unit, 125: image processing unit, 131: region of interest setting unit, 132: sampling coordinate setting unit, 133: reconstructed image generating unit, 134: region of interest correspondence relationship estimating unit, 135: region of interest adjusting unit

The invention claimed is:

1. A method for adjusting a field-of-view of a charged particle microscope device, the method comprising, with use of the charged particle microscope device:
a reference data setting step of setting reference data for a sample;
a region of interest setting step of setting a plurality of regions of interest for the reference data;
a sampling coordinate setting step of setting a rough sampling coordinate group for each of the plurality of regions of interest;
a sampling coordinate imaging step of irradiating the sample with charged particles based on the sampling coordinate group to obtain a corresponding pixel value group;
a reconstructed image generating step of generating, based on the pixel value group, a plurality of reconstructed images corresponding to the plurality of regions of interest;
a correspondence relationship estimating step of estimating, based on the plurality of reconstructed images, a correspondence relationship among the plurality of regions of interest; and
a region of interest adjusting step of adjusting the plurality of regions of interest based on the correspondence relationship, wherein
in the sampling coordinate setting step, the sampling coordinate group is set based on the reference data.

2. The method for adjusting a field-of-view of a charged particle microscope device according to claim 1, wherein
in the reference data setting step, at least one of
an image of the sample obtained by the charged particle microscope device,
an image reconstructed based on rough sampling data of the sample obtained by the charged particle microscope device,
design data of the sample, and
an image of the sample obtained by a device different from the charged particle microscope device
is set as the reference data.

3. The method for adjusting a field-of-view of a charged particle microscope device according to claim 1, wherein
in the correspondence relationship estimating step, whether the correspondence relationship is estimable is determined, and
in the sampling coordinate imaging step, the number of added frames is controlled based on whether the correspondence relationship is estimable.

4. The method for adjusting a field-of-view of a charged particle microscope device according to claim 1, wherein
the plurality of regions of interest include at least one set of regions of interest having different numbers of samplings.

5. The method for adjusting a field-of-view of a charged particle microscope device according to claim 1, wherein
when the plurality of regions of interest are denoted by $\{ri\}$ (where i=1 to M, M being the number of regions of interest), and
the sampling coordinate group corresponding to a j-th frame (where j=1 to F, F being the number of added frames) of the region of interest $\{ri\}$ is denoted by $\{si, j, k\}$ (where k=1 to Nj, Nj being the number of samplings for each frame),
the sampling coordinate group $\{si, j, k\}$ is set based on a transformation matrix $\{Ti\}$ (i=2 to M) between a first region of interest $\{r1\}$ and another region of interest $\{ri\}$ (i≠1) of the reference data.

6. The method for adjusting a field-of-view of a charged particle microscope device according to claim 1, wherein
when the plurality of regions of interest are denoted by $\{ri\}$ (where i=1 to M, M being the number of regions of interest),
the sampling coordinate group corresponding to a j-th frame (where j=1 to F, F being the number of added frames) of the region of interest $\{ri\}$ is denoted by $\{si, j, k\}$ (where k=1 to Nj, Nj being the number of samplings for each frame),
the pixel value group corresponding to the j-th frame of the region of interest $\{ri\}$ is denoted by $\{yi, j, k\}$, and
the reconstructed image corresponding to the region of interest $\{ri\}$ is denoted by $\{Yi\}$,
the sampling coordinate group $\{si, j, k\}$ is displayed together with at least one of the reference data and the reconstructed image $\{Yi\}$.

7. A charged particle microscope device comprising:
a reference data setting unit configured to set reference data for a sample;
a region of interest setting unit configured to set a plurality of regions of interest for the reference data;
a sampling coordinate setting unit configured to set a rough sampling coordinate group for each of the plurality of regions of interest;
a sampling coordinate imaging unit configured to irradiate the sample with charged particles based on the sampling coordinate group to obtain a corresponding pixel value group;
a reconstructed image generating unit configured to generate, based on the pixel value group, a plurality of reconstructed images corresponding to the plurality of regions of interest;
a correspondence relationship estimating unit configured to estimate, based on the plurality of reconstructed images, a correspondence relationship among the plurality of regions of interest; and
a region of interest adjusting unit configured to adjust the plurality of regions of interest based on the correspondence relationship, wherein
the sampling coordinate setting unit is configured to set the sampling coordinate group based on the reference data.

8. The charged particle microscope device according to claim 7, wherein the reference data setting unit is configured to set, as the reference data, at least one of an image of the sample obtained by the charged particle microscope device, an image reconstructed based on rough sampling data of the sample obtained by the charged particle microscope device, design data of the sample, and an image of the sample obtained by a device different from the charged particle microscope device.

9. The charged particle microscope device according to claim 7, wherein
the correspondence relationship estimating unit is configured to determine whether the correspondence relationship is estimable, and the sampling coordinate imaging unit is configured to control the number of added frames based on whether the correspondence relationship is estimable.

10. The charged particle microscope device according to claim 7, wherein
the plurality of regions of interest include at least one set of regions of interest having different numbers of samplings.

11. The charged particle microscope device according to claim 7, wherein
when the plurality of regions of interest are denoted by $\{ri\}$ (where i=1 to M, M being the number of regions of interest), and
the sampling coordinate group corresponding to a j-th frame (where j=1 to F, F being the number of added frames) of the region of interest $\{ri\}$ is denoted by $\{si, j, k\}$ (where k=1 to Nj, Nj being the number of samplings for each frame),
the sampling coordinate setting unit sets the sampling coordinate group $\{si, j, k\}$ based on a transformation matrix $\{Ti\}$ (i=2 to M) between a first region of interest $\{r1\}$ and another region of interest $\{ri\}$ (i≠1) of the reference data.

12. The charged particle microscope device according to claim 7, further comprising:
a display unit configured to display, when the plurality of regions of interest are denoted by $\{ri\}$ (where i=1 to M, M being the number of regions of interest), the sampling coordinate group corresponding to a j-th frame (where j=1 to F, F being the number of added frames) of the region of interest $\{ri\}$ is denoted by $\{si, j, k\}$ (where k=1 to Nj, Nj being the number of samplings for each frame), the pixel value group corresponding to the j-th frame of the region of interest $\{ri\}$ is denoted by $\{yi, j, k\}$, and the reconstructed image corresponding to the region of interest $\{ri\}$ is denoted by $\{Yi\}$, the sampling coordinate group $\{si, j, k\}$ together with at least one of the reference data and the reconstructed image $\{Yi\}$.

13. A charged particle microscope device comprising:
a region of interest setting unit configured to set a region of interest;
a sampling coordinate setting unit configured to set a rough sampling coordinate group $\{sj, k\}$ (j=1 to F, F being the number of added frames, k=1 to Nj, Nj being the number of samplings for each frame) of a j-th frame for the region of interest;
a sampling coordinate imaging unit configured to irradiate a sample with charged particles based on the sampling coordinate group $\{sj, k\}$ to obtain a corresponding pixel value group $\{pj, k\}$;
a drift amount estimating unit configured to obtain a drift amount group $\{\delta j\}$ (j=2 to F) of a imaging position between a first imaging timing and a j-th imaging timing;
a drift amount correcting unit configured to correct a drift amount in the sampling coordinate group $\{sj, k\}$ using the drift amount group $\{\delta j\}$ to obtain a corrected sampling coordinate group $\{Q(sj, k)\}$; and
a reconstructed image generating unit configured to generate a reconstructed image of the region of interest based on the corrected sampling coordinate group $\{Q(sj, k)\}$ and the pixel value group $\{pj, k\}$, wherein
the drift amount estimating unit includes
a unit configured to merge at least one of the sampling coordinate groups $\{sj, k\}$ to generate a merged sampling coordinate group $\{Cv\}$ ($Cv \subset \{sj, k\}$, v=1 to Nv, Nv being the number of the merged sampling coordinate group, $2 \leq Nv \leq F$),
a unit configured to obtain, for any v, a merged drift amount group $\{\Delta v\}$ based on the merged sampling coordinate group $\{Cv\}$, and
a unit configured to calculate the drift amount group $\{\delta j\}$ based on the merged drift amount group $\{\Delta v\}$.

14. The charged particle microscope device according to claim 13, wherein
a reconstructed image is generated based on at least one of the merged sampling coordinate groups $\{Cv\}$, and the merged drift amount group $\{\Delta v\}$ is calculated based on the reconstructed image.

15. A charged particle microscope device comprising:
a charged particle gun configured to generate a charged particle beam;
a stage on which a sample is placed; and
a processing subsystem, wherein
the processing subsystem is configured to
(1) set a plurality of regions of interest for reference data,
(2) for each of the plurality of regions of interest:
(2A) set a rough sampling coordinate group based on the reference data,
(2B) irradiate the sample with a charged particle beam based on the sampling coordinate group to obtain a corresponding pixel value group, and
(2C) generate a plurality of reconstructed images based on the pixel value group,
(3) estimate, based on the plurality of reconstructed images, a correspondence relationship among the plurality of regions of interest, and
(4) adjust the plurality of regions of interest based on the correspondence relationship.

* * * * *